(12) United States Patent
Yoshimuta

(10) Patent No.: US 7,361,885 B2
(45) Date of Patent: Apr. 22, 2008

(54) TWO-DIMENSIONAL IMAGE DETECTOR

(75) Inventor: Toshinori Yoshimuta, Takatsuki (JP)

(73) Assignee: Shimadzu Corporation, Kyoto-shi (JP)

( * ) Notice: Subject to any disclaimer, the term of this patent is extended or adjusted under 35 U.S.C. 154(b) by 0 days.

(21) Appl. No.: 11/300,548

(22) Filed: Dec. 14, 2005

(65) Prior Publication Data

US 2006/0169872 A1    Aug. 3, 2006

(30) Foreign Application Priority Data

Feb. 3, 2005    (JP) .............................. 2005-027740

(51) Int. Cl.
*H01J 5/02* (2006.01)
(52) U.S. Cl. ...................... 250/239; 250/216
(58) Field of Classification Search .............. 250/239, 250/216; 438/121, 122; 257/706, 434; 361/760
See application file for complete search history.

(56) References Cited

U.S. PATENT DOCUMENTS 5,043,845 A * 8/1991 McDermott .................. 361/705

FOREIGN PATENT DOCUMENTS

JP    2003-14862    1/2003

* cited by examiner

*Primary Examiner*—Georgia Epps
*Assistant Examiner*—Tony Ko
(74) *Attorney, Agent, or Firm*—Rankin, Hill, Porter & Clark LLP

(57) ABSTRACT

A Pb plate and a base board loading electronic components such as a signal processing circuit and a power supply circuit are disposed on a case side so as to decrease the weight and the thickness of a sensor section. Besides, the case has a mechanical strength enough to support the active matrix substrate without deformation. Further, a small-signal amplifier control substrate and a gate driver control circuit substrate are inserted inside the case through slits and electrically connected to the electronic components loaded on the base board.

7 Claims, 2 Drawing Sheets

TWO-DIMENSIONAL IMAGE DETECTOR

The present invention claims foreign priority to Japanese patent application no. 2005-027740, filed on Feb. 3, 2005, the content of which is incorporated herein by reference.

BACKGROUND OF THE INVENTION

1. Field of the Invention

The present invention relates to a two-dimensional image detector which detects a two-dimensional distribution of radial or electromagnetic rays such as particle rays, x-rays, visible light, infrared light, etc., (hereinafter referred as radial rays) as an image, and is used for a medical radial imaging apparatus, an industrial nondestructive inspection apparatus etc.

2. Description of the Related Art

In a two dimensional image detector, an active matrix substrate is integrated with an image sensor for converting radial rays to electric charge signals and a base board. The base board loads an electronic circuit including IC elements such as a small-signal amplifier for the electric charge signals, a control circuit, a gate driver circuit, a signal processing circuit, a power supply circuit, etc., thereon. The active matrix substrate integrated with the image sensor and the base board is fixed detachably to a case. A glass plate is used as the material of the active matrix substrate, whereas an aluminum plate is used as the material of the base plate. In the structure mentioned above, all the members are provided on the base board which holds the active matrix substrate and unitized, and the case serves as a cover of the unit.

Further, in order to shield the IC elements constituting the control circuit, the gate driver circuit, the signal processing circuit, the power supply circuit, etc. from the radial rays and assure their life duration, a sheet-shaped radiation shielding plate such as lead plate (Pb plate) is attached to a back surface side of the active matrix substrate (which is the opposite side of the surface where the image sensor is disposed) (See JP-A-2003-014862). In this structure, in order to prevent the active matrix substrate, which is integrated with the radiation shielding plate of heavy weight, from deformation or destruction, the thickness of the active matrix substrate or the base board integrated with the active matrix substrate needs to be thickened for the sake of mechanical strength required to the active matrix substrate. In such a case, a first base board (hereinafter referred as a reinforcing board), a radiation shielding plate, a second base board (hereinafter referred as a base board) and the electronic circuit including IC elements are attached to the back surface of the active matrix substrate in this order. Alternatively, a base board having a built-in radiation shielding plate is attached to the back surface of the active matrix substrate, and then the electronic circuit including IC elements is attached the back surface of the base board.

The structure of the related-art two-dimensional image detector will be descried below with reference to FIG. 3. An image sensor 1 which converts radial rays to electric charge signals is attached to an active matrix substrate 2. The active matrix substrate 2 is attached to a reinforcing board 3. A Pb plate 4 is attached to a back surface of the reinforcing board 3 as a radiation shielding plate. In order to support the weight of the Pb plate 4 and prevent the active matrix substrate 2 from deformation, the Pb plate 4 is sandwiched and hold between the reinforcing board 3 and a base board 5 without deformation, and integrated with the active matrix substrate 2. On side surfaces of the base board 5, a small-signal amplifier 6 and a gate driver 8 are formed, and on the back surface of the base board 5, a gate driver control circuit substrate 9, a signal processing and control circuit substrate 10 and a power supply substrate 11 are formed. Further, a pair of small-signal amplifier control substrates 7 are surely fixed to both end portions of the back surface of the base board 5 by a metallic fixing part, which is not shown in the figure. The small-signal amplifier control substrate 7 has a small-signal amplifier control circuit and the like, which are mounted thereon.

An output signal line output from the image sensor 1 through the active matrix substrate 2 is connected electrically to the small-signal amplifier 6. The lower portion of the small-signal amplifier 6 is bent toward the back surface of the base board 5, and connected electrically to the control circuit of the small-signal amplifier control substrate 7 and the electronic circuits of the signal processing and control circuit substrate 10 and the power supply substrate 11 formed on the back surface of the base board 5. Further, the lower portion of the gate driver 8 for supplying a read signal to the image sensor 1 is bent toward the back surface of the base board 5, and connected electrically to the gate driver control circuit substrate 9. The assembly of the above-described functional components constitutes a sensor section S, and the sensor section S is fixed detachably to a case 12 in a state such as screwed thereto. The back surface of the case 12 is closed by a back plate 13 after the sensor section S being fixed and electrically connected.

However, the above explained structure of related-art two-dimensional image detector has a problem of the life duration of the IC elements provided on the back surface of the base board 5 being shortened, disadvantage in assembling and difficulty in carrying and preserving (hereinafter referred to as handling) the active matrix substrate 2 especially when the active matrix substrate is a large type. More precisely, heat generated from such as small-signal amplifier 6 or IC elements is conducted to the image sensor 1 by the heat conduction. The image sensor 1 generally gets strongly affected by heat and thus, such the heat conduction is not preferable in terms of life duration and performance of the image sensor 1. Further, fine assembling work such as fixing and electrically connecting the small-signal amplifier control substrate 7 to the base board 5 from the back surface of the heavy sensor section S containing the Pb plate 4, and further bending the small-signal amplifier 6 so as to be connected to the small-signal amplifier control substrate 7 or the circuit placed on the back surface of the base board 5 is required. Although some adjunctive tools and jigs are used because of such a complex assembling work, workability of which is bad in that it results in increasing of working time due to the strain from a careful operation not to hurt oneself or not to damage the components by error during the operation. In addition, the sensor section S having precision components has a difficulty in handling due to its several ten kilograms of weight and a carefulness required when carrying and preserving without a cover.

SUMMARY OF THE INVENTION

It is an object of the present invention to provide a two-dimensional image detector which solves the above problems of the related art.

According to a first aspect of the present invention, a base board, which loads an electronic component such as a signal processing circuit and a power supply circuit thereon, is separated from a sensor section having an active matrix substrate, and disposed on a case side. Further, the case has a mechanical strength enough to support the active matrix substrate without deformation of the active matrix substrate.

With the above-mentioned structure, the strength required for the sensor section can be minimized, which enables the weight and the size of the sensor section to be reduced. As a result, the handling of the sensor section can be improved.

According to a second aspect of the present invention, as set forth in the first aspect of the present invention, a slit is provided on the base board disposed on the case side. An electric signal input-output terminal formed on an end portion of a small-signal amplifier control substrate disposed on the active matrix substrate is inserted inside the case through the slit without bending of a small signal amplifier, a gate driver and the like. The electric signal input-output terminal of the small signal amplifier control substrate is connected to a coupling component which is disposed inside the case and conforms to the electric signal input-output terminal, so that the active matrix substrate and a circuit provided on the back surface of the base board are detachably electrically connected to each other.

In the structure described above, most of the heat generated from the small-signal amplifier is directly conducted from the electric signal input-output terminal to the coupling component without conducting through the base board, then conducts to the case and diffuses. Therefore, the heat is unlikely to be conducted to an image sensor. Furthermore, assembling work can be simplified due to the detachable electric connection, being free from bending operation of such as the small-signal amplifier for the purpose of connection to the heavy component of the sensor section such as a electronic component loading board or the circuit on the back surface of the base board.

According to a third aspect of the present invention, as set forth in the first aspect of the present invention, a radiation shielding plate is attached to at least one part of a surface of the case where the active matrix substrate is attached.

Therefore, as mentioned in the first aspect of the present invention, the above described structure in the third aspect of the present invention also improves the handling of the sensor section since the weight of the sensor section can be reduced.

According to a fourth aspect of the present invention, as set forth in the second aspect of the present invention, a radiation shielding plate is attached to at least one part of a surface of the case where the active matrix substrate is attached. Further, a slit is provided on the radiation shielding plate at the portion that corresponds to the slit on the base board. An electric signal input-output terminal disposed on the active matrix substrate side is inserted inside the case through the slits and connected to a coupling component disposed inside the case, which conforms to the electric signal input-output terminal, so that the active matrix substrate and the base board are detachably electrically connected to each other.

Therefore, as mentioned in the second aspect of the present invention, most of the heat generated from the small-signal amplifier is directly conducted from the electric signal input-output terminal to the coupling component without conducting through the base board, then conducts to the case and diffuses. Therefore, the heat is unlikely to be conducted to an image sensor. Furthermore, assembling work can be simplified due to the detachable electric connection being free from bending operation of such as the small-signal amplifier for the purpose of connection to the heavy component of the sensor section such as an electronic component loading board or the circuit on the back surface of the base board.

According to a fifth aspect of the present invention, the reinforcing board is integrated with the active matrix substrate so as to reinforce the strength of the active matrix substrate.

Therefore, the above described effects obtained by each of the first to fourth aspects can be achieved even with the active matrix substrate that does not have enough strength from the beginning.

DETAILED DESCRIPTION OF THE PREFERRED EMBODIMENT

Preferred embodiments of the present invention will be explained below.

A Pb plate and a base board loading an electronic component such as a signal processing circuit and a power supply circuit are disposed on a case, and the case has a mechanical strength enough to support the active matrix substrate without deformation or destruction of the active matrix substrate. Further, slits are provided at the Pb plate and the base board. A small-signal amplifier control substrate is inserted inside the case through the slits without bending a small-signal amplifier, and connected to a coupling component such as a socket or connector, which conforms to the shape of the end portion of the small-signal amplifier control substrate, so that the active matrix substrate and a circuit provided on the back surface of the board are detachably electrically connected to each other.

Figure 1:
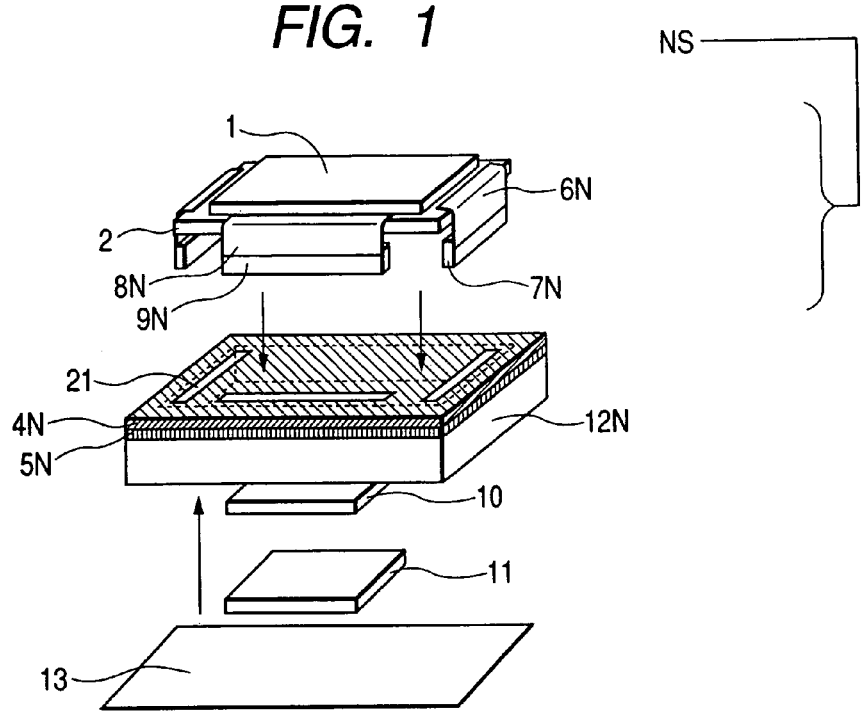
FIG. 1 is a view showing the structure of a two-dimensional image detector of an embodiment according to the present invention.
Figure 3:
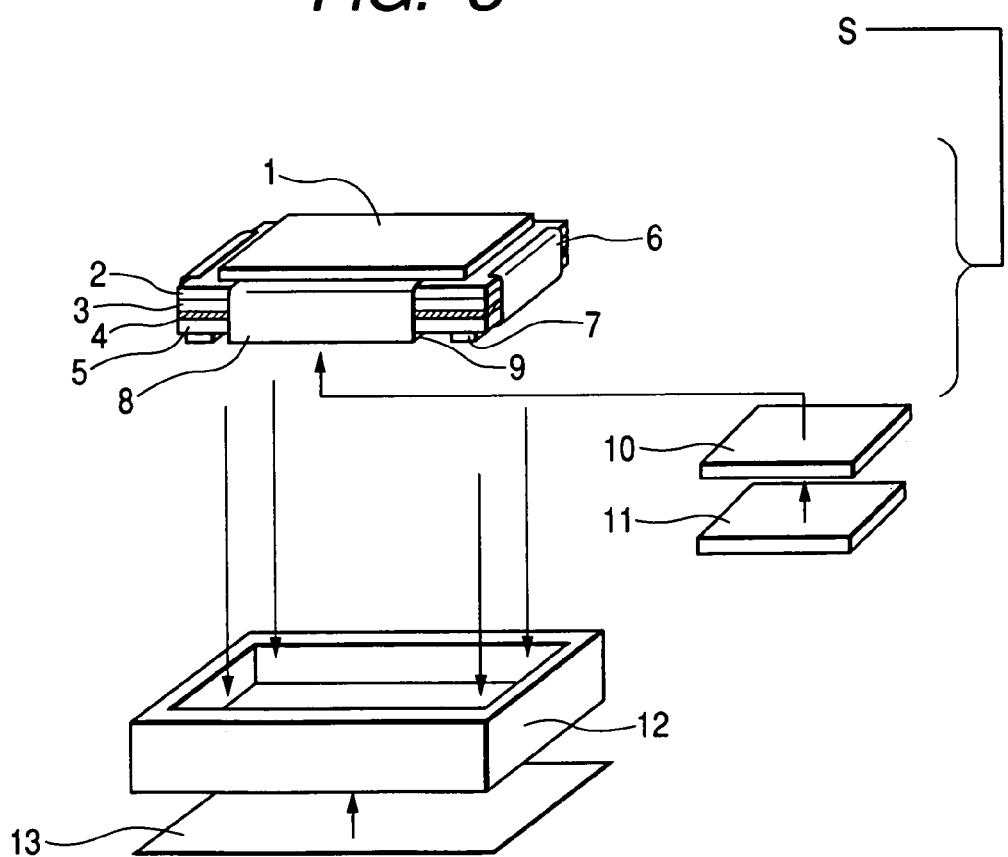
FIG. 3 is a view showing the structure of the related-art two-dimensional image detector.

FIG. 1 is a view showing the structure of a two-dimensional image detector of an embodiment according to the present invention. In FIG. 1, the components labeled the same reference numbers as FIG. 3 have the same structure and performance as FIG. 3. An image sensor 1 is attached to an active matrix substrate 2. An output signal line output from the image sensor 1 is electrically connected to a small-signal amplifier 6N which is attached on a side surface of the active matrix substrate 2. Further, the small-signal amplifier 6N is electrically connected to a small-signal amplifier control substrate 7N. The small-signal amplifier control substrate 7N loads a control circuit and the like thereon. A gate driver 8N is electrically connected to both the image sensor 1 and a gate driver control circuit substrate 9N. The assembly of the above-described functional components constitutes a sensor section NS.

A Pb plate 4N as a radiation shielding plate, and a base board 5N are disposed on a side, which is opposite to the sensor section NS (hereinafter referred as sensor section NS side), of a case 12N. The base board 5N is provided with a signal processing/control circuit substrate 10 and a power supply substrate 11 on its back surface. The end portions of the small-signal amplifier control substrate 7N and the gate driver control circuit substrate 9N serve as electric signal input-output terminals of the sensor section NS. The small-signal amplifier control substrate 7N and the gate driver control circuit substrate 9N are inserted inside the case 12N through three slits 21 provided on the Pb plate 4N and the base board 5N. Then, the end portions of the small-signal amplifier control substrate 7N and the gate driver control circuit substrate 9N are detachably electrically connected to the electronic components loaded on the base board 5N via a connecting component (not illustrated in the figure) such as a socket and a connector which are provided inside the case 12N and conform to the shapes of the end portion of the small-signal amplifier control substrate 7N and the gate driver control circuit substrate 9N. After all the electrical and mechanical connections being done, the case 12N is closed by a back plate 13.

Figure 2:
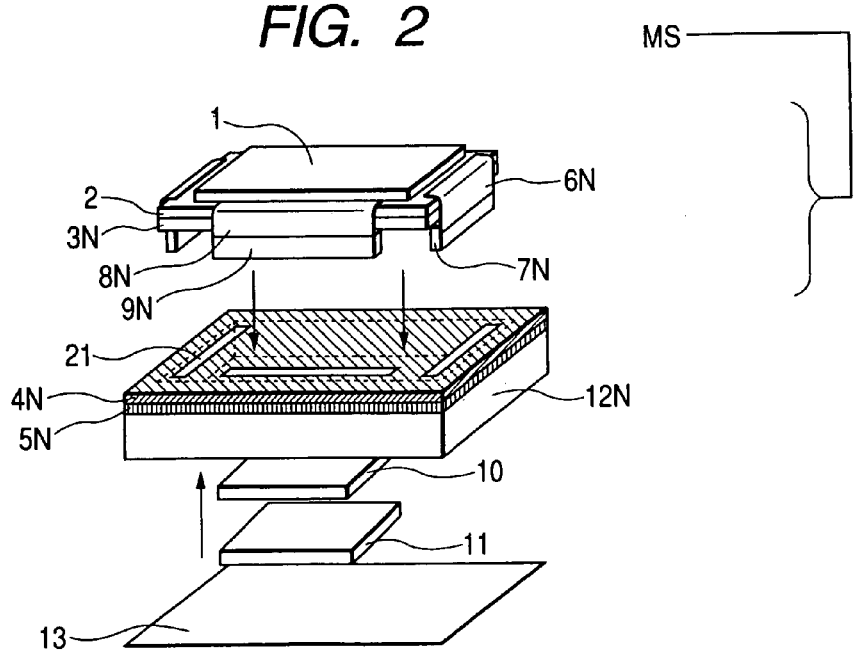
FIG. 2 is a view showing the structure of a two-dimensional image detector of another embodiment of the present invention.

FIG. 2 is a view showing the structure of a two-dimensional image detector of another embodiment according to the present invention. In FIG. 2, the components labeled the same reference numbers as FIGS. 1 and 3 have the same structure and performance as FIGS. 1 and 3. An active matrix substrate 2 is integrated with a reinforcing board 3N that has the minimum thickness required for the convenient handling. A sensor section MS includes an image sensor 1, the active matrix substrate 2, the reinforcing board 3N, a small-signal amplifier 6N, a small-signal amplifier control substrate 7N, a gate driver 8N and a gate driver control circuit substrate 9N. Since the structures and performances of a case 12N, slits 21, a Pb plate 4N, a base board 5N, a signal processing/control circuit substrate 10, a power supply substrate 11 and a back plate 13 are the same as the embodiment illustrated in FIG. 1, their detailed explanation will be omitted.

The present invention is not limited to the above-mentioned embodiments, and the various modified embodiments can be made. For example, regarding the embodiments illustrated in FIG. 1 and FIG. 2, spacers can be provided on four corners of the case 12, and the sensor section NS can be attached to the case 12N via the spacers so as to increase the heat radiation efficiency of the sensor section NS and to shut out the heat conduction to the base board 5N. Further, the materials of the active matrix substrate 2, the reinforcing board 3N, the base board 5N, the radiation shielding plate, etc. are not limited to glass, aluminum plate or a Pb plate. Various materials can be used as their material in accordance with the conditions required, and the present invention is not limited to the material of the components. It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

The present invention can be applied to the application which utilizes the function of detecting a two-dimensional distribution of radial or electromagnetic rays such as particle rays, x-rays, visible light, infrared light, etc. as an image, for example, applied to the medical radial imaging apparatus, the industrial nondestructive inspection apparatus etc.

What is claimed is:

1. A two-dimensional image detector comprising:
   an active matrix substrate, which is integrated with a semiconductor layer converting an electromagnetic ray information to an electric charge information, for reading out the electric charge information;
   a case having a mechanical strength sufficient to support the active matrix substrate without deformation of the active matrix substrate; and
   a base board disposed on an open end of the case, said base board holding an electronic component which is disposed on a side of the base board facing the case such that the electronic component is within the case, and said base board having the active matrix substrate disposed on a side of the base board opposite the case, wherein the active matrix substrate and the electronic component are electrically connected to each other,
   wherein the active matrix substrate has an electric signal input-output terminal and the base board has a slit through which the electric signal input-output terminal is inserted inside the case, and
   wherein said two-dimensional image detector further comprises a coupling component disposed inside the case, conforming to the electric signal input-output terminal, through which the active matrix substrate and the electronic component are detachably electrically connected to each other.

2. The two-dimensional image detector according to claim 1, wherein the electronic component includes a signal processing circuit and a power supply circuit.

3. The two-dimensional image detector according to claim 1, further comprising:
   a radiation shielding plate attached to at least one part of a surface of the case where the active matrix substrate is attached, said radiation shielding plate being disposed between the active matrix substrate and the base board.

4. The two-dimensional image detector according to claim 1, further comprising:
   a radiation shielding plate attached to at least one part of a surface of the case where the active matrix substrate is attached, said radiation shielding plate being disposed between the active matrix substrate and the base board,
   wherein the radiation shielding plate has a slit corresponding to the slit on the base board, through which the electric signal input-output terminal is inserted inside the case and connected to the coupling component so that the active matrix substrate and the electronic component are detachably electrically connected to each other.

5. The two-dimensional image detector according to claim 1, wherein the active matrix substrate is integrated with a reinforcing board.

6. A method of manufacturing a two-dimensional image detector according to claim 1, the method comprising steps of:
   disposing the base board on the open end of the case;
   inserting an electric signal input-output terminal of the active matrix substrate inside the case through a slit formed in the base board; and
   detachably electrically connecting the active matrix substrate and the electronic component through a coupling component disposed inside the case, the coupling component conforming to the electric signal input-output terminal.

7. The method of manufacturing a two-dimensional image detector according to claim 6, the method further comprising steps of:
   attaching a radiation shielding plate to at least one part of a surface of the case, said radiation shielding plate being disposed between the active matrix substrate and the base board; and
   inserting an electric signal input-output terminal of the active matrix substrate inside the case through a slit provided on the shielding plate and the slit provided on the base board.

* * * * *